United States Patent
Seyanagi

(10) Patent No.: US 9,539,693 B2
(45) Date of Patent: Jan. 10, 2017

(54) POLISHING PAD

(71) Applicant: TOYO TIRE & RUBBER CO., LTD., Osaka-shi, Osaka (JP)

(72) Inventor: Hiroshi Seyanagi, Osaka (JP)

(73) Assignee: ROHM AND HAAS ELECTRONIC MATERIALS CMP HOLDINGS, INC., Newark, DE (US)

( * ) Notice: Subject to any disclaimer, the term of this patent is extended or adjusted under 35 U.S.C. 154(b) by 0 days.

(21) Appl. No.: 14/761,292

(22) PCT Filed: Jan. 15, 2014

(86) PCT No.: PCT/JP2014/050577
§ 371 (c)(1),
(2) Date: Jul. 15, 2015

(87) PCT Pub. No.: WO2014/119367
PCT Pub. Date: Aug. 7, 2014

(65) Prior Publication Data
US 2015/0360341 A1 Dec. 17, 2015

(30) Foreign Application Priority Data
Jan. 29, 2013 (JP) .................... 2013-014623

(51) Int. Cl.
*B24B 37/24* (2012.01)
*C08G 18/48* (2006.01)
(Continued)

(52) U.S. Cl.
CPC ............ *B24B 37/24* (2013.01); *B24D 11/003* (2013.01); *C08G 18/00* (2013.01); *C08G 18/12* (2013.01);
(Continued)

(58) Field of Classification Search
CPC . C08G 18/4808; C08G 18/4854; C08G 18/12; C08G 18/3206; B24B 37/24; B24D 11/003; C08J 9/122
See application file for complete search history.

(56) References Cited

U.S. PATENT DOCUMENTS

| | | | |
|---|---|---|---|
| 2005/0064709 A1 | 3/2005 | Shimomura et al. | |
| 2009/0104850 A1 | 4/2009 | Ogawa et al. | |
| 2010/0048102 A1* | 2/2010 | Nakai | B24B 37/24 451/41 |

FOREIGN PATENT DOCUMENTS

| | | |
|---|---|---|
| JP | 2000017252 A | 1/2000 |
| JP | 2000072844 A | 3/2000 |

(Continued)

OTHER PUBLICATIONS

International Search Report (ISR) mailed Mar. 18, 2014, issued for International application No. PCT/JP2014/050577.
(Continued)

*Primary Examiner* — Michael L Leonard
(74) *Attorney, Agent, or Firm* — Law Office of Katsuhiro Arai

(57) ABSTRACT

A polishing pad has a polishing layer that is formed of a polyurethane foam having fine cells. The polyurethane foam is a reaction cured body of a chain extender and an isocyanate-terminated prepolymer which is obtained by reacting a prepolymer starting material composition that contains an isocyanate component, a high molecular weight polyol and an aliphatic diol. The high molecular weight polyol contains a polyalkylene glycol A that has a peak of the molecular weight distribution within the range of 200 to 300 and a polyalkylene glycol B that has a peak of the molecular weight distribution within the range of 800 to 1200.

6 Claims, 1 Drawing Sheet

(51) Int. Cl.
*B24D 11/00* (2006.01)
*C08J 9/12* (2006.01)
*H01L 21/306* (2006.01)
*C08G 18/00* (2006.01)
*C08G 18/72* (2006.01)
*C08G 18/12* (2006.01)
*C08G 18/32* (2006.01)
*C08G 101/00* (2006.01)

(52) U.S. Cl.
CPC ....... *C08G 18/3206* (2013.01); *C08G 18/4808* (2013.01); *C08G 18/4854* (2013.01); *C08G 18/724* (2013.01); *C08J 9/122* (2013.01); *H01L 21/30625* (2013.01); *C08G 2101/00* (2013.01); *C08J 2201/026* (2013.01); *C08J 2205/044* (2013.01); *C08J 2375/04* (2013.01)

(56) References Cited

FOREIGN PATENT DOCUMENTS

| JP | 3359629 B1 | 12/2002 |
| JP | 2007061928 A | 3/2007 |
| JP | 2010240769 A | 10/2010 |

OTHER PUBLICATIONS

Notification of Transmittal of Translation of the International Preliminary Report on Patentability (PCT/IB/338) mailed Aug. 13, 2015, with International Preliminary Report on Patentability (PCT/IB/373) and Written Opinion of the International Searching Authority (PCT/ISA/237), for corresponding international application PCT/JP2014/050577.

\* cited by examiner

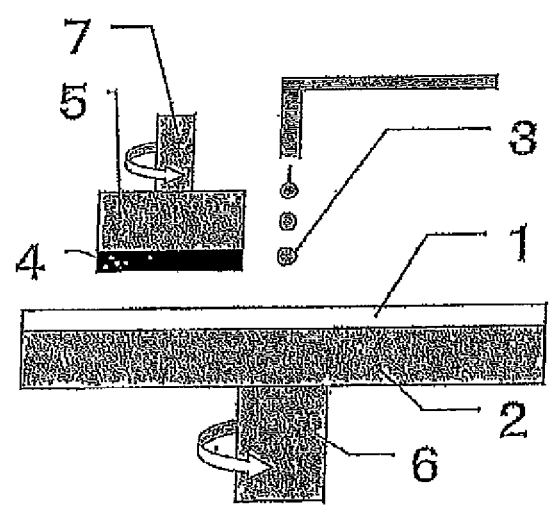

POLISHING PAD

This application is the U.S. National Phase under 35 U.S.C. §371 of International Application PCT/JP2014/050577, filed Jan. 15, 2014, which claims priority to Japanese Patent Application No. 2013-014623, filed Jan. 29, 2013. The International Application was published under PCT Article 21(2) in a language other than English.

TECHNICAL FIELD

The invention relates to a polishing pad capable of performing planarization of materials requiring a high surface planarity such as optical materials including a lens and a reflecting mirror, a silicon wafer, a glass substrate or an aluminum substrates for a hard disc and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon.

BACKGROUND ART

Typical materials requiring surface flatness at high level include a single-crystal silicon disk called a silicon wafer for producing semiconductor integrated circuits (IC, LSI). The surface of the silicon wafer should be flattened highly accurately in a process of producing IC. LSI etc., in order to provide reliable semiconductor connections for various coatings used in manufacturing the circuits. In the step of polishing finish, a polishing pad is generally stuck on a rotatable supporting disk called a platen, while a workpiece such as a semiconductor wafer is stuck on a polishing head. By movement of the two, a relative speed is generated between the platen and the polishing head while polishing slurry having abrasive grains is continuously supplied to the polishing pad, to effect polishing processing.

As polishing characteristics of a polishing pad, it is requested that an object to be polished is excellent in planarity and in-plane uniformity and a polishing rate is large. A planarity and in-plane uniformity of an object to be polished can be improved to some extent with a polishing layer higher in elastic modulus. A polishing rate can be bettered by increasing a holding quantity of a slurry on a foam with cells therein.

Polishing pads including a polyurethane foam are proposed as polishing pads that meet the above properties (see Patent Documents 1 and 2). Such a polyurethane foam is produced by a reaction of an isocyanate-terminated prepolymer with a chain extender (curing agent), in which in view of hydrolysis resistance, elastic properties, wear resistance, or the like, a polyether (a polytetramethylene glycol with a number average molecular weight of 500 to 1,600) or a polycarbonate is preferably used as a high molecular polyol component for the isocyanate prepolymer.

However, the polishing pad has a problem such that the hardness is reduced at moisture or water absorption and the planarization characteristics thereby deteriorate gradually.

Moreover, in order to suppress the reduction in hardness of the polishing pad at moisture or water absorption, if the elastic modulus of the polishing pad is increased, the service life tends to be reduced due to deterioration in wear resistance. Thus, it has been difficult to achieve a balance between the wear resistance and the suppression of reduction in the hardness of the polishing pad.

In order to obtain a polyurethane elastomer cast product excellent in wear resistance and mechanical property, Patent Document 3 proposes a polyurethane elastomer composition for casting, containing a curing agent (liquid B) and an NCO group-terminated urethane prepolymer (liquid A) that is obtained by respectively using tolylene diisocyanate as an isocyanate component, a polytetramethylene ether glycol having a number average molecular weight of 500 to 4000 and a low molecular weight glycol having no side chain as glycol components and reacting these compounds.

Patent Document 4 proposes a polishing pad having a polishing layer including a polyurethane resin foam having fine cells, wherein a high molecular weight polyol component that is a starting component of the polyurethane foam contains a hydrophobic high molecular weight polyol A having a number average molecular weight of 550 to 800 and a hydrophobic high molecular weight polyol B having a number average molecular weight of 950 to 1300 in an A/B ratio of from 10/90 to 50/50 by weight. Patent Document 4 also describes that the polishing pad is excellent in polishing rate and superior in service life characteristics without generating center slow.

Patent Document 5 proposes a polishing pad having a polishing layer made of non-foamed polyurethane, wherein the non-foamed polyurethane is a reaction cured body of a polyurethane starting material composition which contains an isocyanate-terminated prepolymer obtained by the reaction of a prepolymer starting material composition containing a diisocyanate, a high molecular weight polyol, and a low molecular weight polyol; an isocyanate degenerated body which is polymerized by the addition of three or more diisocyanates; and a chain extender, wherein the addition amount of the isocyanate degenerated body is 5 to 30 parts by weight based on 100 parts by weight of the isocyanate-terminated prepolymer. It is also stated in Patent Document 5 that the polishing pad hardly causes scratches on the surface of an object to be polished and is excellent in dressing properties.

PRIOR ART DOCUMENTS

Patent Documents

Patent Document 1: JP-A-2000-17252
Patent Document 2: Japanese Patent No. 3359629
Patent Document 3: JP-A-2000-72844
Patent Document 4: JP-A-2007-61928
Patent Document 5: JP-A-2010-240769

SUMMARY OF THE INVENTION

Problems to be Solved by the Invention

An object of the present invention is to provide a polishing pad which hardly causes deterioration due to water absorption in a hygroscopic environment, is excellent in polishing properties and service life characteristics, and has a high polishing rate, and to provide a method for manufacturing the same. Another object of the invention is to provide a method of manufacturing a semiconductor device with the polishing pad.

Means for Solving the Problems

As a result of investigations to solve the problems, the inventors have found that the objects can be achieved with the polishing pad described below, and have completed the invention.

That is, the present invention relates to a polishing pad having a polishing layer that is formed of a polyurethane foam having fine cells, wherein the polyurethane foam is a reaction cured body of a chain extender and an isocyanate-terminated prepolymer which is obtained by reacting a prepolymer starting material composition that contains an isocyanate component, a high molecular weight polyol and an aliphatic diol, wherein the high molecular weight polyol contains a polyalkylene glycol A that has a peak of the molecular weight distribution within the range of 200 to 300 and a polyalkylene glycol B that has a peak of the molecular weight distribution within the range of 800 to 1200.

The present inventor has found that a polyurethane with tough and extensible properties can be obtained by using a polyalkylene glycol A that has a peak of the molecular weight distribution within the range of 200 to 300 in combination with a polyalkylene glycol B that has a peak of the molecular weight distribution within the range of 800 to 1200 (that is, to use polyalkylene glycols having two peaks in the molecular weight distribution), as a high molecular weight polyol starting material for polyurethane. The polishing pad (polishing layer) formed from the polyurethane is excellent in service life characteristics because of its superior wear resistance.

If the peak of the molecular weight distribution of the polyalkylene glycol A is out of the range of 200 to 300, the strength (hardness or breaking strength) becomes excessive or insufficient. When the strength is too high, the polyurethane foam becomes hard and brittle and the service life of the polishing pad is reduced. When the strength is too low, deterioration due to water absorption is likely to occur in a hygroscopic environment, so that the polishing properties and service life of the polishing pad are reduced. In addition, if the peak of the molecular weight distribution of the polyalkylene glycol B is out of the range of 800 to 1200, the elongation, i.e., the elasticity of the polishing pad becomes excessive or insufficient. When the elongation is too large, it becomes difficult to dress the surface of the polishing pad, resulting in deterioration of the surface renewal property. When the elongation is too small, the polyurethane foam becomes hard and brittle and thus the service life of the polishing pad is reduced.

Moreover, since the aliphatic diol is blended in the prepolymer starting material composition, the hardness of the polyurethane is less likely to decrease even at moisture absorption or water absorption. Therefore, the polishing pad (polishing layer) that is formed from the polyurethane has a large polishing rate (polishing amount), and the deterioration due to water absorption is unlikely to occur even in a hygroscopic environment, so that deterioration in the planarization characteristics is unlikely to occur.

The blending amount of the polyalkylene glycol A is preferably 25 to 35 parts by weight based on 100 parts by weight of the polyalkylene glycol B. If the blending amount of the polyalkylene glycol A is less than 25 parts by weight, the strength (hardness or breaking strength) becomes lower and the same disadvantages as above occur. On the other hand, if the blending amount of the polyalkylene glycol A exceeds 35 parts by weight, the elasticity becomes excessive and thus the same disadvantages as above occur.

The aliphatic diol is preferably 1,4-butanediol. The blending amount of the aliphatic diol is preferably 1 to 7% by weight in the prepolymer starting material composition. If the blending amount of the aliphatic diol is less than 1% by weight, the deterioration due to water absorption is likely to occur in a hygroscopic environment, and if the blending amount is more than 7% by weight, the elasticity tends to become excessive because the ratio of chain extension becomes larger.

The isocyanate component preferably contains an aromatic diisocyanate and an aliphatic diisocyanate and/or an alicyclic diisocyanate. The combined use of them makes it easy to control the curing reaction rate while maintaining the strength during the reaction of an isocyanate-terminated prepolymer with a chain extender.

The polyurethane foam contains preferably 3 to 10 parts by weight of a silicone-based surfactant based on 100 parts by weight of an isocyanate-terminated prepolymer. By blending 3 to 10 parts by weight of the silicone-based surfactant, it is possible to improve the planarization characteristics by suppressing the surface pressure variation of the polishing pad due to viscoelastic effects. Moreover, since the plasticity can be imparted to the polyurethane foam, the wear resistance of the polyurethane foam is thereby improved. If the blending amount of the silicone-based surfactant is less than 3 parts by weight, the foam of fine cells is unlikely to be obtained. On the other hand, if the blending amount of the silicone-based surfactant exceeds 10 parts by weight, the polyurethane foam having a high hardness tends to be hardly obtained due to the plasticizing effect of the surfactant.

In addition, the polyurethane foam has preferably an average cell diameter of 20 to 70 μm and a cut rate of 2 μm/min or less. When the average cell diameter may deviate from the above range, the polishing rate tends to decrease or the planarity (flatness) of an object to be polished after polishing tends to decrease. Also, if the cut rate is greater than 2 μm/min, the service life of the polishing pad is reduced, which is not desirable.

Moreover, the polyurethane foam has preferably a hardness reduction rate of 20% or less at water absorption and a breaking strength reduction rate of 20% or less at water absorption. If the hardness reduction rate at water absorption is more than 20%, the planarization characteristics of the polishing pad are gradually deteriorated. If the breaking strength reduction rate at water absorption is more than 20%, the polishing rate is gradually decreased with significantly worsened service life characteristics (shortening of the service life) of the polishing pad.

The present invention is also related to a method for producing a polishing pad, comprising the steps of:

(C) synthesizing an isocyanate-terminated prepolymer and (D) mixing a first component containing the isocyanate-terminated prepolymer with a second component containing a chain extender and curing the mixture to prepare a polyurethane foam, wherein:

the step (C) comprises reacting an isocyanate component with an aliphatic diol and a polyalkylene glycol A that has a peak of the molecular weight distribution within the range of 200 to 300 to synthesize a prepolymer precursor and then reacting the prepolymer precursor with a polyalkylene glycol B that has a peak of the molecular weight distribution within the range of 800 to 1200 to synthesize the isocyanate-terminated prepolymer, and the step (D) comprises adding 3 to 10 parts by weight of a silicone-based surfactant based on 100 parts by weight of the isocyanate-terminated prepolymer, to the first component containing the isocyanate-terminated prepolymer, further stirring the first component together with a non-reactive gas to form a cell dispersion liquid in which the non-reactive gas is dispersed in the form of fine cells, then mixing the second component containing the chain extender into the cell dispersion liquid, and curing the mixture to prepare a polyurethane foam.

The present invention is also related to a method for manufacturing a semiconductor device, including the step of polishing a surface of a semiconductor wafer using the polishing pad.

Effect of the Invention

Since the polishing pad of the present invention is formed of polyurethane that is tough and extensible, such a polishing pad is excellent in wear resistance as well as in service life characteristics. Further, since the polishing pad of the present invention is formed of polyurethane that makes it difficult to decrease the hardness even at moisture absorption or water absorption, the polishing rate is large and the planarization characteristics are hardly deteriorated.

BRIEF DESCRIPTION OF THE DRAWINGS

FIG. 1 is a schematic view showing one example of a polishing apparatus used in CMP polishing.

MODE FOR CARRYING OUT THE INVENTION

The polishing pad of the invention includes a polishing layer including a polyurethane foam having fine cells. The polishing pad of the invention may be only the polishing layer or a laminated body of the polishing layer and any other layer (such as a cushion layer).

The polyurethane foam is a reaction cured body of a chain extender and an isocyanate-terminated prepolymer which is obtained by reacting a prepolymer starting material composition that contains an isocyanate component, a high molecular weight polyol and an aliphatic diol.

As the isocyanate component, a compound known in the field of polyurethane can be used without particular limitation. The isocyanate monomer includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof. Among them, an aromatic diisocyanate is preferably used in combination with an aliphatic diisocyanate and/or an alicyclic diisocyanate, and in particular, toluene diisocyanate is preferably used in combination with isophorone diisocyanate.

As the high molecular weight polyol, there are used a polyalkylene glycol A that has a peak of the molecular weight distribution within the range of 200 to 300 and a polyalkylene glycol B that has a peak of the molecular weight distribution within the range of 800 to 1200.

The polyalkylene glycol A has preferably a peak of the molecular weight distribution within the range of 230 to 270, and the polyalkylene glycol B has preferably a peak of the molecular weight distribution within the range of 950 to 1050.

The polyalkylene glycols A and B include, for example, polyethylene glycol, polypropylene glycol, polytetramethylene glycol, and polyhexamethylene glycol.

The number average molecular weight of the polyalkylene glycol A is preferably 200 to 300, more preferably 230 to 270, from the viewpoint of maintaining the strength of the polyurethane.

The number average molecular weight of the polyalkylene glycol B is preferably 800 to 1200, more preferably 950 to 1050, from the viewpoint of the viscoelastic properties of the polyurethane.

The blending amount of the polyalkylene glycol A is preferably 25 to 35 parts by weight, more preferably 28 to 30 parts by weight, based on 100 parts by weight of the polyalkylene glycol B.

It is preferable to use only the polyalkylene glycols A and B as the high molecular weight polyol. However, other high molecular weight polyols in the range not to impair the effects of the present invention, including, for example, polyester polyols, polycaprolactone polyols, polyester polycarbonate polyols, and polycarbonate polyols, may be used singly or in combination.

The aliphatic diol is not particularly limited, and is preferably an aliphatic diol having 2 to 6 carbon atoms, including, for example, 1,2-ethanediol, 1,2-propanediol, 1,3-propanediol, 1,3-butanediol, 1,4-butanediol, 2,3-butanediol, 1,5-pentanediol, 3-methyl-1,5-pentanediol, and 1,6-hexanediol. These may be used singly or may be used in combination of two or more kinds thereof. Of these, it is particularly preferable to use 1,4-butanediol.

It is preferred to blend the aliphatic diol in an amount of 1 to 7% by weight, more preferably 1 to 3% by weight, into the prepolymer starting material composition.

In the range not to impair the effects of the present invention, one or more kinds of low molecular weight polyols, low molecular weight polyamines, and alcohol amines may be added to the prepolymer starting material composition.

Examples of the low molecular weight polyol include 1,4-cyclohexanedimethanol, diethylene glycol, triethylene glycol, 1,4-bis(2-hydroxyethoxy)benzene, trimethylolpropane, glycerin, 1,2,6-hexanetriol, pentaerythritol, tetramethylolcyclohexane, methylglucoside, sorbitol, mannitol, dulcitol, sucrose, 2,2,6,6-tetrakis(hydroxymethyl)cyclohexanol, diethanolamine, N-methyldiethanolamine, and triethanolamine. One or more of these polyols may be used alone or in any combination.

Examples of the low molecular weight polyamine include ethylenediamine, tolylenediamine, diphenylmethanediamine, diethylenetriamine, etc. These may be used singly or in combination of two or more.

Examples of the alcohol amine include monoethanolamine, 2-(2-aminoethylamino)ethanol, monopropanolamine, etc. These may be used singly or in combination of two or more.

In the production of the isocyanate-terminated prepolymer, the isocyanate component, the high molecular weight polyol, the aliphatic diol and so on are blended in such a manner that the NCO index falls within the range of 1.7 to 2.1. The NCO index is preferably 1.95 to 2.05.

The isocyanate-terminated prepolymer is synthesized by reacting an isocyanate component with an aliphatic diol and a polyalkylene glycol A that has a peak of the molecular weight distribution within the range of 200 to 300 to synthesize a prepolymer precursor, and then reacting the prepolymer precursor with a polyalkylene glycol B that has a peak of the molecular weight distribution within the range of 800 to 1200. It is preferred to react the isocyanate component with the aliphatic diol at first and then react the reacted isocyanate component with the polyalkylene glycol A that has a peak of the molecular weight distribution within the range of 200 to 300, thereby to synthesize the prepolymer precursor. By adopting the above-described synthetic method, a theoretically perfect isocyanate-terminated prepolymer with a reduced polymerization degree is obtained. In other words, the isocyanate-terminated prepolymer of the present invention includes a main chain portion containing a polyalkylene glycol A that has a peak of the molecular weight distribution within the range of 200 to 300 and a main chain portion containing a polyalkylene glycol B that has a peak of the molecular weight distribution within the range of 800 to 1200.

It is preferable to add about 1% by weight of a heat stabilizer (for example, triphenyl phosphite, etc.) to the resulting isocyanate-terminated prepolymer. Thereby, it becomes possible to suppress the reaction between the isocyanate-terminated prepolymer and moisture during storage, as well as to inhibit the aging caused by heat that is secondarily applied to the polyurethane foam prepared with use of the isocyanate-terminated prepolymer.

A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5,5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5,5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; the low molecular weight polyol; and the low molecular weight polyamine. The chain extenders described above may be used either alone or in mixture of two kinds or more.

The mixing ratio of the isocyanate-terminated prepolymer and the chain extender may be varied depending on the molecular weight of each material and the desired physical properties of the polishing pad. The number of isocyanate groups in the prepolymers is preferably from 0.8 to 1.2, more preferably from 0.99 to 1.15 per the number of active hydrogen groups (hydroxyl groups and/or amino groups) in the chain extender. If the number of isocyanate groups is outside the range, insufficient curing could occur so that the required specific gravity or hardness could not be achieved, which tends to decrease the polishing properties.

The polyurethane foam is preferably produced by melting method in view of cost, working environment and so on, while it may be produced by application of any known urethane foaming techniques such as melting method and solution technique.

Note that an isocyanate-terminated prepolymer with a molecular weight of the order in the range of from 800 to 5000 is preferable because of excellency in workability and physical properties.

The polyurethane foam is produced by mixing a first component containing the isocyanate-terminated prepolymer with a second component containing the chain extender and curing the mixture.

The method of producing the polyurethane foam may be a method of adding hollow beads, a mechanical foaming method, a chemical foaming method, or the like. While any combination of these methods may be used, in particular, a mechanical foaming method is preferably performed using a silicone surfactant comprising a copolymer of polyalkylsiloxane and polyether. Compounds suitable as the silicone surfactant include SH-192 and L-5340 (manufactured by Dow Corning Toray Silicone Co., Ltd.), B8443 and B8465 (manufactured by Goldschmidt Chemical Corporation), etc. The silicone surfactant is preferably added 3 to 10 parts by weight, more preferably 3 to 7.5 parts by weight, based on 100 parts by weight of the isocyanate-terminated prepolymer.

Various additives may be mixed; such as a stabilizer including an antioxidant, a lubricant, a pigment, a filler, an antistatic agent and others.

Description will be given of an example of a method of producing a thermosetting polyurethane foam of a fine cell type constituting a polishing pad (a polishing layer) below. A method of manufacturing such the polyurethane foam has the following steps:

1) Foaming Step of Preparing Cell Dispersion Liquid

The step includes adding a silicone surfactant to the first component containing the isocyanate-terminated prepolymer so that the silicone surfactant is added 3 to 10 parts by weight based on 100 parts by weight of the isocyanate-terminated prepolymer and stirring the mixture in the presence of a non-reactive gas to form a cell dispersion liquid in which the non-reactive gas is dispersed in the form of fine cells. In a case where the prepolymer is solid at an ordinary temperature, the prepolymer is preheated to a proper temperature and used in a molten state.

2) Curing Agent (Chain Extender) Mixing Step

The second component containing a chain extender is added into the cell dispersion liquid, which is agitated to thereby obtain a foaming reaction liquid.

3) Casting Step

The forming reaction liquid is cast into a mold.

4) Curing Step

The foaming reaction liquid having been cast into the mold is heated and reaction-cured.

The non-reactive gas used for forming fine cells is preferably not combustible, and is specifically nitrogen, oxygen, a carbon dioxide gas, a rare gas such as helium and argon, and a mixed gas thereof, and the air dried to remove water is most preferable in respect of cost.

In the method of producing the polyurethane foam, heating and post-curing of the foam obtained after casting and reacting the forming reaction liquid in a mold until the dispersion lost fluidity are effective in improving the physical properties of the foam, and are extremely preferable. The forming reaction liquid may be cast in a mold and immediately post-cured in a heating oven, and even under such conditions, heat is not immediately conducted to the reactive components, and thus the diameters of cells are not increased. The curing reaction is conducted preferably at normal pressures to stabilize the shape of cells.

A known catalyst promoting polyurethane reaction, such as tertiary amine-based catalysts, may be used. The type and amount of the catalyst added are determined in consideration of flow time in casting in a predetermined mold after the mixing step.

Production of the polyurethane foam may be in a batch system where each component is weighed out, introduced into a vessel and mixed or in a continuous production system where each component and a non-reactive gas are continuously supplied to, and stirred in, a stirring apparatus and the resulting forming reaction liquid is transferred to produce molded articles.

A manufacturing method of a polishing pad may be performed in ways: in one of which a prepolymer which is a raw material from which a polyurethane foam is made is put into a reaction vessel, thereafter a chain extender is mixed into the prepolymer, the mixture is agitated, thereafter the mixture is cast into a mold with a predetermined size to thereby prepare a block and the block is sliced with a slicer like a planer or a band saw; and in another of which in the step of casting into the mold, a thin sheet may be directly produced. Besides, a still another way may be adopted in which a resin of raw material is melted, the melt is extruded through a T die to thereby mold a polyurethane foam directly in the shape of a sheet.

An average cell diameter of the polyurethane foam is preferably in the range of from 20 to 70 μm and more preferably in the range of from 30 to 60 μm. If an average cell diameter falls outside the range, a tendency arises that a planarity of an object to be polished after polishing is reduced.

Preferably, the polyurethane foam has a specific gravity ranging from 0.5 to 1.0. When the specific gravity is less than 0.5, the surface strength of the polishing layer decreases, so that the planarity of the object to be polished tends to decrease. When the specific gravity is larger than 1.0, the cell number on the surface of the polishing layer decreases, so that the polishing rate tends to decrease despite excellent planarity.

The cut rate of the polyurethane foam is preferably 2 μm/min or less, more preferably 1.7 μm/min or less.

A hardness of the polyurethane foam is preferably in the range of from 45 to 65 degrees, more preferably in the range of from 50 to 60 degrees as measured with an Asker D hardness meter. When the Asker D hardness is less than 45 degrees, the planarity of the object to be polished decreases, while when the hardness is more than 65 degrees, the uniformity of the object to be polished tends to decrease despite excellent planarity.

Moreover, the hardness reduction rate of the polyurethane foam at water absorption is preferably 20% or less, more preferably 15% or less.

In addition, the breaking strength reduction rate of the polyurethane foam at water absorption is preferably 20% or less, more preferably 14% or less.

A polishing pad (polishing layer) of the invention is provided with a depression and a protrusion structure for holding and renewing a slurry. Though in a case where the polishing layer is formed with a fine foam, many openings are on a polishing surface thereof which works so as to hold the slurry, a depression and protrusion structure are preferably provided on the surface of the polishing side thereof in order to achieve more of holdability and renewal of the slurry or in order to prevent induction of dechuck error, breakage of an object to be polished or decrease in polishing efficiency. The shape of the depression and protrusion structure is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These depression and protrusion structure are generally those having regularity, but the groove pitch, groove width, groove depth etc. can also be changed at each certain region to make retention and renewal of slurry desirable.

No specific limitation is placed on a thickness of a polishing layer, but a thickness thereof is about 0.8 to 4 mm, preferably 1.5 to 2.5 mm.

A polishing pad of the invention may also be a laminate of a polishing layer and a cushion sheet adhered to each other.

The cushion sheet (cushion layer) compensates for characteristics of the polishing layer. The cushion sheet is required for satisfying both planarity and uniformity which are in a tradeoff relationship in CMP. Planarity refers to flatness of a pattern region upon polishing an object to be polished having fine unevenness generated upon pattern formation, and uniformity refers to the uniformity of the whole of an object to be polished. Planarity is improved by the characteristics of the polishing layer, while uniformity is improved by the characteristics of the cushion sheet. The cushion sheet used in the polishing pad of the present invention is preferably softer than the polishing layer.

The material forming the cushion sheet is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

Means for adhering the polishing layer to the cushion sheet include: for example, a method in which a double-sided tape is sandwiched between the polishing layer and the cushion sheet, followed by pressing.

A polishing pad of the invention may be provided with a double-sided tape on the surface of the pad adhered to a platen.

A semiconductor device is fabricated after operation in a step of polishing a surface of a semiconductor wafer with a polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a polishing pad (a polishing layer) 1, a polishing head 5 holding a semiconductor wafer 4, a backing material for applying a uniform pressure against the wafer and a supply mechanism of a polishing agent 3. The polishing pad 1 is mounted on the polishing platen 2 by adhering the pad to the platen with a double-sided tape. The polishing platen 2 and the polishing head 5 are disposed so that the polishing pad 1 and the semiconductor wafer 4 supported or held by them oppositely face each other and provided with respective rotary shafts 6 and 7. A pressure mechanism for pressing the semiconductor wafer 4 to the polishing pad 1 is installed on the polishing head 5 side. During polishing, the semiconductor wafer 4 is polished by being pressed against the polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.
[Measurement and Evaluation Method]
(Measurement of Peaks of Molecular Weight Distribution of Polyalkylene Glycols A, B, and C)

The molecular weight distribution of the prepared isocyanate-terminated prepolymer was measured by GPC (gel permeation chromatography), and the peak of the polyalkylene glycol A having an isocyanate group at each end, the peak of the polyalkylene glycol B having an isocyanate group at each end, and the peak of the polyalkylene glycol C having an isocyanate group at each end were confirmed from the obtained charts.
(Measurement of Number-Average Molecular Weight of Polyalkylene Glycol)

A number-average molecular weight was measured by GPC (a Gel Permeation Chromatography) and a value as measured was converted in terms of standard polystyrene molecular weight, and the apparatus and conditions in operation were as follows:

GPC apparatus was an apparatus manufactured by Shimadzu Corp., with Model Number of LC-10A.

Columns that were used in measurement were ones manufactured by Polymer Laboratories Co., in which three columns were in connection including (PL gel, 5 μm and 500 Å), (PL gel, 5 μm and 100 Å) and (PL gel, 5 μm and 50 Å).

A flow rate was 1.0 ml/min.
A concentration was 1.0 g/l.
An injection quantity was 40 μl.
A column temperature was 40° C.
An eluent was tetrahydrofuran.

(Measurement of Average Cell Diameter)

The prepared polyurethane foam was sliced with a microtome cutter into measurement samples each with the thinnest possible thickness of 1 mm or less. A surface of a sample was photographed with a scanning electron microscope (S-3500N, Hitachi Science Systems Co., Ltd.) at a magnification of ×100. An effective circular diameter of each of all cells in an arbitrary area was measured with an image analyzing soft (manufactured by MITANI Corp. with a trade name WIN-ROOF) and an average cell diameter was calculated from the measured values.
(Measurement of Specific Gravity)

Determined according to JIS Z8807-1976. A manufactured polyurethane foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).
(Measurement of Hardness)

Measurement is conducted according to JIS K6253-1997. A manufactured polyurethane foam cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.
(Measurement of Hardness Reduction Rate at Water Absorption)

The prepared polyurethane foam was cut into a piece with a size of 2 cm×2 cm (with arbitrary thickness) and served as a measurement sample. The sample was immersed in distilled water and allowed to stand for 48 hours in an environment of a temperature of 23° C.±2° C. and a humidity of 50%±5%. After that, the sample was taken out to measure the hardness in the same manner as above, so that the hardness reduction rate was calculated.
(Measurement of Tensile Storage Elastic Modulus)

A dynamic viscoelasticity meter (DMA861e manufactured by Mettler-Toledo International Inc.) was used to measure the tensile storage elastic modulus. The measurement conditions are as follows.

Frequency: 1.6 Hz
Rate of temperature rise: 2.0° C./min
Measuring temperature range: 0° C. to 90° C.
Sample form: 19.5 mm (length)×3.0 mm (width)×1.0 mm (thickness)
(Measurement of Breaking Strength Reduction Rate at Water Absorption)

In accordance with JIS K6251 (Vulcanized Rubber and Thermoplastic Rubber—Determination of Tensile Properties), a breaking strength was measured using a sample which had been obtained by punching out the prepared polyurethane foam by a dumbbell No. 3. Also, the sample was immersed in distilled water, allowed to stand in an environment of a temperature of 23° C.±2° C. and a humidity of 50%±5% for 48 hours, and taken out to measure the breaking strength in the same manner as above and then calculate the breaking strength reduction rate.
(Measurement of Cut Rate)

The prepared polyurethane foam sheet (380 mm φ, 1.25 mm thick) was attached to the platen of a polishing apparatus (MAT-BC15, manufactured by MAT Inc.). The surface of the polyurethane foam sheet was dressed using a dresser (spot type, manufactured by Mitsubishi Materials Corporation) under the conditions of a forced drive rotation speed of 115 rpm, a platen rotation speed of 70 rpm, a dressing load of 7 pounds, a water absorption rate of 200 ml/minute, and a dressing time of 1.5 hours. After the dressing, a 10 mm wide, 380 mm long strip sample was cut from the polyurethane foam sheet. The thickness of the sample was measured at points spaced at intervals of 20 mm along the central part (9 points on one side, 18 points in total). The difference (wear amount) between the measured thicknesses of the central part and the each point along the central part was calculated, and then the average of the differences was calculated. The cut rate is calculated from the following equation:

$$\text{the cut rate } (\mu\text{m/minute}) = (\text{the average wear amount})/(1.5 \times 60).$$

(Evaluation of Polishing Characteristics)

The prepared polishing pad was used to evaluate polishing characteristics by using a polishing apparatus SPP600S (manufactured by Okamoto Machine Tool Works, Ltd.). An about 1 μm thermal-oxide film deposited on an 8-inch silicon wafer was polished by 0.5 μm per one plate, and polishing rate was calculated from the time of this polishing. Table 1 shows the polishing rate of the 100th wafer. The thickness of the oxide film was measured by using an interference film thickness measuring instrument (manufactured by Otsuka Electronics Co., Ltd). During polishing, silica slurry (SS12 manufactured by Cabot) was added at a flow rate of 150 ml/min. Polishing loading was 350 g/cm², the number of revolutions of the polishing platen was 35 rpm, and the number of revolutions of the wafer was 30 rpm.

Example 1

Synthesis of Isocyanate-Terminated Prepolymer

To a reaction vessel were added 66.95 parts by weight of toluene diisocyanate (a mixture of toluene 2,4-diisocyanate/toluene 2,6-diisocyanate=80/20) and 11.00 parts by weight of isophorone diisocyanate, and the mixture was adjusted to 50° C. with stirring. Thereafter, 2.68 parts by weight of 1,4-butanediol were added to the reaction vessel and the temperature of the reaction vessel was adjusted to 75° C. Then, the temperature of the reaction vessel was lowered to 55° C., and 2.68 parts by weight of 1,4-butanediol were further added. After the temperature of the reaction vessel was adjusted to 75° C., the temperature was lowered to 55° C. and 10.7 parts by weight of polytetramethylene glycol A having a number molecular weight of 250 (peak of molecular weight distribution: 250) were added thereto. The reaction was carried out for 30 minutes while adjusting the temperature of the reaction vessel to 80° C. Thereafter, the temperature of the reaction vessel was lowered to 55° C. and 10.7 parts by weight of polytetramethylene glycol A having a number average molecular weight of 250 were further added. After adjusting the temperature of the reaction vessel to 80° C., the reaction was carried out for 30 minutes. After that, the temperature of the reaction vessel was lowered to 60° C., and 73.24 parts by weight of polytetramethylene glycol B having a number average molecular weight of 1000 (peak of molecular weight distribution: 1000). Then, the temperature of the reaction vessel was adjusted to 80° C., and the reaction was carried out for one hour to synthesize an isocyanate-terminated prepolymer. Thereafter, 1.82 parts by weight of triphenyl phosphite (trade name: ADK STAB TPP) as a heat stabilizer were added to the reaction vessel and the mixture was stirred for 30 minutes. Then, carbon dioxide gas and air contained in the isocyanate-terminated prepolymer were defoamed under reduced pressure by using a vacuum pump.

(Production of Polishing Pad)

To a reaction vessel were added 100 parts by weight of the isocyanate-terminated prepolymer and 3 parts by weight of a silicone-based surfactant (B8465 manufactured by Goldschmidt Co., Ltd.), and the mixture was blended, adjusted to 80° C., and defoamed under reduced pressure. The mixture was then vigorously stirred with a stirring blade at a rotation number of 900 rpm for about 4 minutes in such a manner that bubbles were incorporated into the reaction system. To the mixture was added 28.6 parts by weight of 4,4'-methylenebis (o-chloroaniline) (IHARACUAMINE-MT, manufactured by IHARA CHEMICAL INDUSTRY CO., LTD.) which had been previously melted at 120° C. The mixture liquid was stirred for about 1 minute and then poured into a loaf-shaped open mold (casting vessel). When the mixture liquid lost its fluidity, it was placed in an oven and subjected to post curing at 110° C. for 6 hours so that a polyurethane foam block was obtained.

While heated at about 80° C., the polyurethane foam block was sliced using a slicer (VGW-125 manufactured by AMITEC Corporation) so that a polyurethane foam sheet was obtained. The surface of the sheet was then buffed with a buffing machine (manufactured by AMITEC Corporation) until the sheet had a thickness of 1.27 mm. As a result, the sheet had adjusted thickness accuracy. The buffed sheet was formed by punching to have a diameter of 61 cm, and concentric grooves, 0.25 mm in width, 1.50 mm in pitch, and 0.40 mm in depth, were formed in the surface of the sheet using a grooving machine (manufactured by Techno Corporation) so that a polishing layer was obtained. A double-faced adhesive tape (Double Tack Tape manufactured by Sekisui Chemical Co., Ltd.) was bonded to the surface of the polishing layer opposite to the grooved surface using a laminator. The surface of a corona-treated cushion sheet (Toraypef manufactured by Toray Industries, Inc. (0.8 µm-thick polyethylene foam)) was buffed. The buffed cushion sheet was bonded to the double-faced adhesive tape using a laminator. Another double-faced adhesive tape was also bonded to the other side of the cushion sheet using a laminator so that a polishing pad was prepared.

Example 2

A polishing pad was produced in the same manner as in Example 1, except for adopting the composition shown in Table 1.

Comparative Example 1

Synthesis of Isocyanate-Terminated Prepolymer

To a reaction vessel were added 77 parts by weight of polytetramethylene glycol B having a number average molecular weight of 1000 (peak of molecular weight distribution: 1000), 13 parts by weight of polytetramethylene glycol C having an average molecular weight of 650 (peak of molecular weight distribution: 650), and 10 parts by weight of diethylene glycol, and the mixture was dehydrated for 2 hours under reduced pressure with stirring. Then, nitrogen was introduced into the reaction vessel so that the atmosphere was replaced by nitrogen, and 62 parts by weight of toluene diisocyanate and 10 parts by weight of dicyclohexylmethane diisocyanate were added thereto. The reaction mixture was stirred until completion of the reaction while maintaining the temperature of the reaction system at about 70° C. Thereafter, the product was defoamed under reduced pressure for 2 hours to obtain an isocyanate-terminated prepolymer.

(Production of Polishing Pad)

To a reaction vessel were added 100 parts by weight of the isocyanate-terminated prepolymer and 5 parts by weight of a silicone-based surfactant (L5340 manufactured by NUC Corporation), and the mixture was blended, adjusted to 80° C., and defoamed under reduced pressure. The mixture was then vigorously stirred with a stirring blade at a rotation number of 900 rpm for about 4 minutes in such a manner that bubbles were incorporated into the reaction system. To the mixture was added 28.7 parts by weight of 4,4'-methylenebis (o-chloroaniline) (IHARACUAMINE-MT, manufactured by IHARA CHEMICAL INDUSTRY CO., LTD.) which had been previously melted at 120° C. The mixture liquid was stirred for about 1 minute and then poured into a loaf-shaped open mold (casting vessel). When the mixture liquid lost its fluidity, it was placed in an oven and subjected to post curing at 110° C. for 6 hours so that a polyurethane foam block was obtained. Thereafter, a polishing pad was produced in the same manner as in Example 1.

Comparative Example 2

To a reaction vessel were added 95.2 parts by weight of a polyether-based prepolymer (ADIPRENE L-325, NCO concentration: 2.22 meq/g, manufactured by Uniroyal Inc.), 4.8 parts by weight of a polymerized 1,6-hexamethylene diisocyanate as an isocyanate-modified body (SUMIDUR N-3300, isocyanurate type, manufactured by Sumika Bayer Urethane Co., Ltd.), and 3 parts by weight of a silicone-based surfactant (B8465 manufactured by Goldschmidt Co., Ltd.), and the mixture was blended, adjusted to 80° C., and defoamed under reduced pressure. The mixture was then vigorously stirred with a stirring blade at a rotation number of 900 rpm for about 4 minutes in such a manner that bubbles were incorporated into the reaction system. To the mixture was added 29.7 parts by weight of 4,4'-methylenebis (o-chloroaniline) (IHARACUAMINE-MT, manufactured by IHARA CHEMICAL INDUSTRY CO., LTD.) which had been previously melted at 120° C. The mixture liquid was stirred for about 1 minute and then poured into a loaf-shaped open mold (casting vessel). When the mixture liquid lost its fluidity, it was placed in an oven and subjected to post curing at 110° C. for 6 hours so that a polyurethane foam block was obtained. Thereafter, a polishing pad was produced in the same manner as in Example 1.

employed, especially, in a planarization step of a silicon wafer or a device on which an oxide layer or a metal layer has been formed prior to further stacking an oxide layer or a metal layer thereon.

DESCRIPTION OF REFERENCE SIGNS

1: Polishing pad (Polishing layer)
2: Polishing platen
3: Polishing agent (Slurry)
4: Object to be polished (Semiconductor wafer)
5: Supporting stand (Polishing head)
6, 7: Rotary shafts

The invention claimed is:
1. A method for producing a polishing pad, comprising the steps of:
(C) synthesizing an isocyanate-terminated prepolymer and
(D) mixing a first component containing the isocyanate-terminated prepolymer with a second component con-

TABLE 1

| | | Example 1 | Example 2 | Comparative example 1 | Comparative example 2 |
|---|---|---|---|---|---|
| Synthesis of prepolymer | Toluene diisocyanate (part by weight) | 66.95 | 62.4 | 62 | — |
| | Isophorone diisocyanate (part by weight) | 11 | 11 | — | — |
| | Dicyclohexylmethane diisocyanate (part by weight) | — | — | 10 | — |
| | Polytetramethylene glycol A (part by weight) | 21.4 | 21.4 | — | — |
| | Polytetramethylene glycol B (part by weight) | 73.24 | 73.24 | 77 | — |
| | Polytetramethylene glycol C (part by weight) | — | — | 13 | — |
| | 1,4-Butanediol (part by weight) | 5.36 | — | — | — |
| | 1,5-Pentanediol (part by weight) | — | 4.8 | — | — |
| | Diethylene glycol (part by weight) | — | — | 10 | — |
| | Index [NCO]/[OH] | 2.00 | 2.00 | 2.00 | — |
| | NCOwt % | 10.00 | 10.00 | 9.43 | — |
| Triphenyl phosphite (part by weight) | | 1.82 | 1.76 | — | — |
| Prepolymer (part by weight) | | 100 | 100 | 100 | — |
| ADIPRENE L-325 (part by weight) | | — | — | — | 95.2 |
| SUMIDUR N-3300 (part by weight) | | — | — | — | 4.8 |
| IHARACUAMINE MT (part by weight) | | 28.6 | 28.6 | 28.7 | 29.7 |
| Index [NCO]/[NH$_2$] | | 1.1 | 1.1 | 1.05 | 1.1 |
| B8465 (part by weight) | | 3 | 3 | — | 3 |
| L5340 (part by weight) | | — | — | 5 | — |
| Physical properties of polishing pad | Average cell diameter (μm) | 42 | 42 | 55 | 48 |
| | Specific gravity | 0.75 | 0.75 | 0.8 | 0.8 |
| | D hardness (degree) | 53 | 53 | 55 | 53 |
| | Hardness reduction rate at water absorption (%) | 14.4 | 15 | 35 | 15.9 |
| | Tensile storage elastic modulus (MPa) | 280 | 280 | 260 | 255 |
| | Breaking strength reduction rate at water absorption (%) | 13.5 | 14 | 40 | 17.8 |
| | Cut rate (μm/min) | 1.57 | 1.65 | 7.6 | 1.92 |
| | Polishing rate (Å/min) | 3800 | 3700 | 2330 | 3600 |

INDUSTRIAL APPLICABILITY

A polishing pad of the invention is capable of performing planarization materials requiring a high surface planarity such as optical materials including a lens and a reflective mirror, a silicon wafer, an aluminum substrate and a product of general metal polishing with stability and a high polishing efficiency. A polishing pad of the invention is preferably taining a chain extender and curing the mixture to prepare a polyurethane foam, wherein:
the step (C) comprises reacting an isocyanate component with an aliphatic diol and a polyalkylene glycol A that has number average molecular weight within the range of 200 to 300 to synthesize a prepolymer precursor and then reacting the prepolymer precursor with a poly-alkylene glycol B that has a number average molecular weight within the range of 800 to 1200 to synthesize the isocyanate-terminated prepolymer, and the step (D) comprises adding 3 to 10 parts by weight of a silicone-based surfactant based on 100 parts by weight of the isocyanate-terminated prepolymer, to the first component containing the isocyanate-terminated prepolymer, further stirring the first component together with a non-reactive gas to form a cell dispersion liquid in which the non-reactive gas is dispersed in the form of fine cells, then mixing the second component containing the chain extender into the cell dispersion liquid, and curing the mixture to prepare a polyurethane foam.

2. The method according to claim 1, wherein the aliphatic diol is 1,4-butanediol.

3. The method according to claim 1, wherein the blending amount of the aliphatic diol is 1 to 7% by weight in the prepolymer starting material composition.

4. The method according to claim 1, wherein the isocyanate component contains an aromatic diisocyanate and an aliphatic diisocyanate and/or an alicyclic diisocyanate.

5. The method according to claim 1, wherein the polyurethane foam has an average cell diameter of 20 to 70 μm and a cut rate of 2 μm/min or less.

6. The method according to claim 1, wherein the polyurethane foam has a hardness reduction rate of 20% or less at water absorption and a breaking strength reduction rate of 20% or less at water absorption.

* * * * *